United States Patent
Sun et al.

(10) Patent No.: US 10,120,053 B2
(45) Date of Patent: Nov. 6, 2018

(54) MAGNETIC RESONANCE IMAGING METHOD AND APPARATUS

(71) Applicant: Siemens Aktiengesellschaft, Munich (DE)

(72) Inventors: Zhi Guo Sun, Shenzhen (CN); Qiong Zhang, Shenzhen (CN)

(73) Assignee: Siemens Aktiengesellschaft, Munich (DE)

( * ) Notice: Subject to any disclaimer, the term of this patent is extended or adjusted under 35 U.S.C. 154(b) by 564 days.

(21) Appl. No.: 14/815,002

(22) Filed: Jul. 31, 2015

(65) Prior Publication Data

US 2016/0033607 A1 Feb. 4, 2016

(30) Foreign Application Priority Data

Jul. 31, 2014 (CN) .......................... 2014 1 0373011

(51) Int. Cl.
*G01R 33/561* (2006.01)
*G01R 33/54* (2006.01)

(52) U.S. Cl.
CPC ...... *G01R 33/5616* (2013.01); *G01R 33/5614* (2013.01)

(58) Field of Classification Search
CPC ...................................... G01R 33/56–33/5676
See application file for complete search history.

(56) References Cited

U.S. PATENT DOCUMENTS 5,798,642 A * 8/1998 Watanabe ............ G01R 33/563
324/307
8,159,221 B2 * 4/2012 Yui ..................... G01R 33/5614
324/307
2006/0036154 A1 * 2/2006 Deimling ........... G01R 33/4816
600/410
2009/0010514 A1 * 1/2009 Kimura ............ G01R 33/56509
382/131
2010/0198053 A1 * 8/2010 Miyazaki ............... A61B 5/055
600/419
2013/0237806 A1 * 9/2013 Blumhagen .......... A61B 5/0035
600/411
2014/0300356 A1 * 10/2014 Stemmer ............ G01R 33/5616
324/309
2015/0108976 A1 * 4/2015 Fischer ............. G01R 33/5616
324/309

* cited by examiner

*Primary Examiner* — Huy Q Phan
*Assistant Examiner* — David Frederiksen
(74) *Attorney, Agent, or Firm* — Schiff Hardin LLP

(57) ABSTRACT

In a magnetic resonance imaging method and apparatus, the scanner is operated with a multi-echo sequence in order to acquire k-space data of a multi-echo magnetic resonance signal, and the k-space data are used to reconstruct a magnetic resonance image. The multi-echo magnetic resonance signal is an asymmetric multi-echo magnetic resonance signal, and the asymmetric multi-echo magnetic resonance signal includes N asymmetric echo magnetic resonance signals, wherein N is greater than or equal to 2. Asymmetric echo magnetic resonance signals can be acquired in a dual-echo steady-state sequence, so that scanning time is reduced and the degree of comfort of a subject is improved because the magnetization process reaches a steady state quickly so the magnetic resonance signal is less affected by inhomogeneities that may exist in the basic magnetic field or a gradient magnetic field, and the intensity of the magnetic resonance signal is increased.

8 Claims, 3 Drawing Sheets

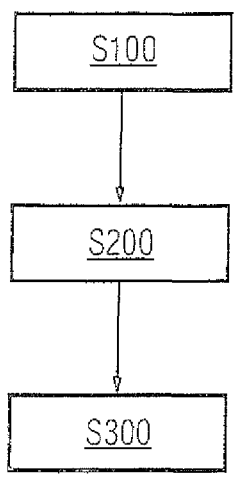
Fig. 1
FIG 4
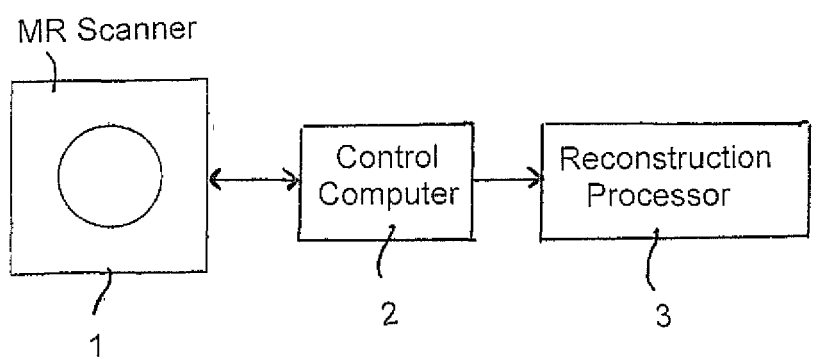

MAGNETIC RESONANCE IMAGING METHOD AND APPARATUS

BACKGROUND OF THE INVENTION

Field of the Invention

The present invention relates to the technical field of magnetic resonance imaging, and particularly to a three-dimensional magnetic resonance imaging method and system.

Description of the Prior Art

Magnetic resonance imaging (MRI) is an imaging technology using magnetic resonance phenomenon. The principle for magnetic resonance phenomenon mainly includes: the protons of atomic nuclei containing an odd number of protons such as the nuclei of hydrogen atoms which are widely present in the human body have spin motion like small magnets, and the spin axes of these small magnets have no definite law; if an external magnetic field is exerted, these small magnets would be rearranged according to the line of magnetic force of the external magnetic field, particularly arranged in the two directions respectively parallel to or anti-parallel to the line of magnetic force of the external magnetic field, in which the above-mentioned direction parallel to the line of magnetic force of the external magnetic field is termed as a positive longitudinal axis while the above-mentioned direction anti-parallel to the line of magnetic force of the external magnetic field is termed as a negative longitudinal axis; the atomic nuclei only have longitudinal magnetized vectors, in which the longitudinal magnetized vectors have both direction and amplitude. The atomic nuclei in an external magnetic field are subjected to a pulse excitation using a radio frequency (RF) of a specific frequency so as to enable the spin axes of these atomic nuclei to deviate from the positive longitudinal axis or the negative longitudinal axis to produce resonance, which is magnetic resonance phenomenon. The atomic nuclei would have transverse magnetized vectors after the spin axes of the above excited atomic nuclei deviate from the positive longitudinal axis or the negative longitudinal axis.

The absorbed energy is gradually released in the form of electromagnetic waves as the excited atomic nuclei emit echo signals after the radio frequency pulse emission stops, then both the phase and energy level of the excited atomic nuclei recover to the states prior to excitation, and an image can be reconstructed after further processing, e.g. space encoding the echo signals emitted from the atomic nuclei.

In the prior art, the dual echo steady state (DESS) sequence has obvious advantages on the imaging of complex anatomical structures, especially in a three-dimensional magnetic resonance image, and the isotropic high-resolution voxels of the three-dimensional magnetic resonance image produced by the dual echo steady state (DESS) sequence are used to allow the image be able to be reformatted into any plane, thus facilitating the diagnosis. Unfortunately, the running time based on the dual echo steady state (DESS) sequence is approximately five minutes, while the relatively long scanning time would affect the degree of comfort of a patient.

FIG. 3 is a schematic diagram for the dual echo steady state sequence according to the prior art. As shown in FIG. 3, the dual echo steady state sequence according to the prior art comprises a second radio frequency pulse RF2 and a second gradient pulse, in which the duration among the various second radio frequency pulses RF2 is the second repetition time TR2, the second gradient pulse comprises a second readout gradient pulse Gr2, a second layer selection gradient Gs2 and a second phase gradient (not shown); the second readout gradient Gr2 further comprises a second predispersion phase gradient PrePhase2, a second platform gradient RO2 and a second redispersion phase gradient RePhase2, in which the duration and the amplitude of the first predispersion phase gradient PrePhase1 are equal to those of the first redispersion phase gradient RePhase1, and therefore the areas (equal to duration multiplied by amplitude) thereof would also be equal.

As shown in FIG. 1, during the second platform gradient RO2, the magnetic resonance imaging system collects two symmetric echoes (or referred to as one full echo), i.e., the second free induction decay (FID) signal FID2 and the second echo signal Echo2. As shown in FIG. 3, the second repetition time TR2 partially depends on the duration of the two symmetric echoes (or referred to as one full echo).

In addition, as shown in FIG. 3, the latter second echo signal Echo2 is the refocused signal of the former second free induction decay (FID) signal FID2, and therefore the latter second echo (Echo) signal Echo2 keeps the information of the former second free induction decay (FID) signal FID2.

A dual echo steady state (DESS) sequence of magnetic resonance imaging and the calculation method for the acquisition time thereof are introduced in detail in the patent application document with the publication No. CN 1499218 A, belonging to Siemens Ltd. In the prior art, time is saved by means of coil sensitivity information and using parallel acquisition technique, GRAPPA undersampling technique or CAIPIRINHA undersampling technique and the like.

SUMMARY OF THE INVENTION

An object of the present invention is to provide a magnetic resonance (MR) imaging method, which includes the steps of scanning subject in an MR scanner by operating the MR scanner with a multi-echo sequence reading out the k-space data of a multi-echo magnetic resonance signal, and using the k-space data to reconstruct a magnetic resonance image, wherein the multi-echo magnetic resonance signal is an asymmetric multi-echo magnetic resonance signal, and the asymmetric multi-echo magnetic resonance signal includes N asymmetric echo magnetic resonance signals, wherein N is greater than or equal to 2.

Preferably, the multi-echo sequence is a dual echo steady state free precession sequence or a multi-echo data image combination sequence.

Preferably, the multi-echo sequence has a readout gradient, and the readout gradient has a first predispersion phase gradient and a first platform gradient, wherein, the area of the predispersion phase gradient is less than 1/N of the area of the first platform gradient, the area of said first platform gradient is less than the area of a second platform gradient, wherein the second platform gradient reads out a symmetric multi-echo magnetic resonance signal, and the symmetric multi-echo magnetic resonance signals are N full-echo magnetic resonance signals respectively corresponding to the N asymmetric echo magnetic resonance signals.

Preferably, the area of the first platform gradient is 80% of the area of the second platform gradient or an empirical percentage value.

Preferably, the area of the predispersion phase gradient is 80% of 1/N of the area of the first platform gradient or an empirical percentage value.

The present invention also encompasses a magnetic resonance imaging system that has a scanner for scanning a subject with a multi-echo sequence, a gradient coil system for reading out k-space data of a multi-echo magnetic resonance signal, a reconstruction computer that reconstructs a magnetic resonance image using said k-space data, wherein the multi-echo magnetic resonance signal is an asymmetric multi-echo magnetic resonance signal, and said asymmetric multi-echo magnetic resonance signal includes N asymmetric echo magnetic resonance signals.

Preferably, the multi-echo sequence is a dual echo steady state free precession sequence or a multi-echo data image combination sequence.

Preferably, the multi-echo sequence has a readout gradient, the readout gradient having a first predispersion phase gradient and a first platform gradient, wherein the area of the first predispersion phase gradient is less than 1/N of the area of the first platform gradient, the area of the first platform gradient is less than the area of a second platform gradient, wherein the second platform gradient reads out a symmetric multi-echo magnetic resonance signal, and the symmetric multi-echo magnetic resonance signals are N full-echo magnetic resonance signals respectively corresponding to the N asymmetric echo magnetic resonance signals.

Preferably, the area of the first platform gradient is 80% of the area of the second platform gradient or an empirical percentage value.

Preferably, the area of the first predispersion phase gradient is 80% of 1/N of the area of the first platform gradient or an empirical percentage value.

According to the particular embodiments of the present invention, relatively short repetition time and echo time can be obtained by collecting asymmetric echo magnetic resonance signals in a dual-echo steady-state sequence to replace the symmetric echo (full) magnetic resonance signals, so that scanning time is reduced and the degree of comfort of a subject is improved; meanwhile, the relatively short repetition time can also make the magnetization process reach a steady state quickly, and make the magnetic resonance signals be less affected by the inhomogeneity of a main magnetic field or a gradient magnetic field; while the relatively short echo time increases the intensity of the magnetic resonance signals.

In summary, according to the particular embodiments of the present invention, by reading out asymmetric echo magnetic resonance signals in a dual echo steady state sequence to replace the symmetric echo (full) magnetic resonance signals, scanning time is further saved and clinical images of rather good quality are provided.

BRIEF DESCRIPTION OF THE DRAWINGS

FIG. 1 is a step diagram for the magnetic resonance imaging method according to the particular embodiments of the present invention.

FIG. 4 is a block diagram of a magnetic resonance apparatus operable in accordance with the present invention.

DESCRIPTION OF THE PREFERRED EMBODIMENTS

In order to make the objects, technical solutions and advantages of the present invention more apparent, particular embodiments hereinafter are listed for further describing the present invention in detail.

The core of the technical solution of the magnetic resonance imaging method according to the particular embodiments of the present invention is that asymmetric multi-echo magnetic resonance signals are read out as k-space data so as to reconstruct a magnetic resonance image. Owing to the use of the asymmetric multi-echo signal, the time for the scanning sequence is shortened correspondingly and thus the comfort of a patient is improved, meanwhile, it has been demonstrated by experiments that the image quality of the magnetic resonance image reconstructed by using the magnetic resonance imaging method of the particular embodiments of the present invention is superior to that of the prior art.

For a scanning sequence, a multi-echo sequence comprises a dual echo steady state (DESS) sequence or a multi-echo data image combination (MEDIC) sequence, in which the dual echo steady state (DESS) sequence is a relatively typical scanning sequence. Therefore, the technical solution of the present invention is introduced according to the magnetic resonance imaging method of the particular embodiments of the present invention and taking the dual echo steady state (DESS) sequence as an example. However, as described above, the magnetic resonance imaging method according to the present invention is not only limited to the dual echo steady state (DESS) sequence, but also suitable for other multi-echo sequences such as the multi-echo data image combination (MEDIC) sequence.

As shown in FIG. 1, a magnetic resonance imaging method comprises the following the steps: step S100, scanning a multi-echo sequence; step S200, reading out the k-space data of a multi-echo magnetic resonance signal; and step S300, using the k-space data to reconstruct a magnetic resonance image, wherein the multi-echo magnetic resonance signal is an asymmetric multi-echo magnetic resonance signal, and the asymmetric multi-echo magnetic resonance signal includes N asymmetric echo magnetic resonance signals. As described above, the particular embodiments of the present invention are illustrated using the dual echo steady state (DESS) sequence as the multi-echo sequence.

Figure 2:
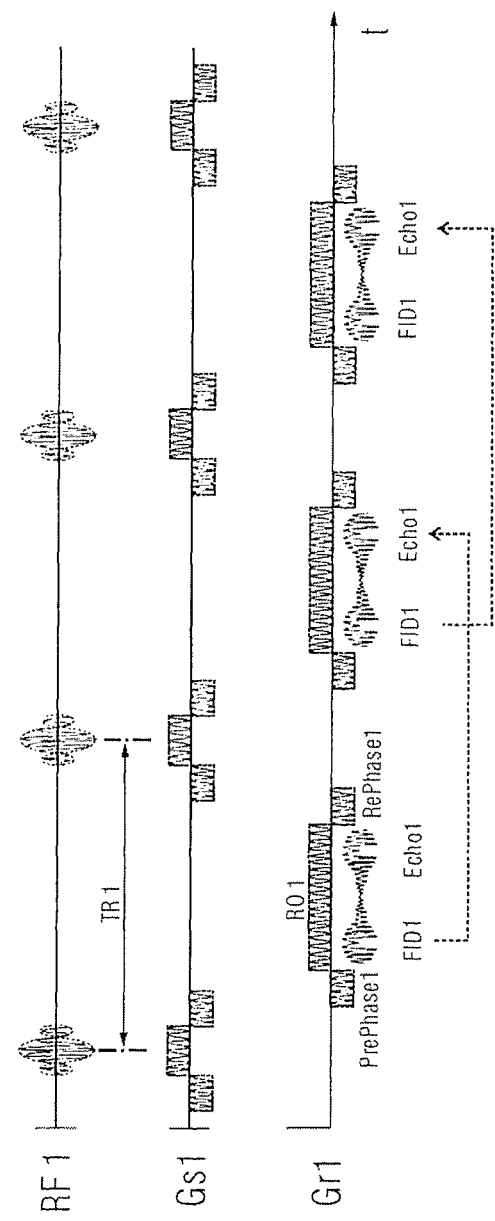
FIG. 2 is a timing diagram for the dual echo steady state sequence according to the particular embodiments of the present invention.

FIG. 2 is a timing diagram for the dual echo steady state sequence according to the particular embodiments of the present invention, wherein step S100 is to scan a dual echo steady state sequence to a subject, in which the dual echo steady state sequence is shown as FIG. 2. The dual echo steady state sequence comprises first radio frequency pulses RF1 and a first gradient pulse, in which the duration among the various first radio frequency pulses RF1 is the first repetition time TR1, the first gradient pulse comprises a first readout gradient pulse Gr1, a first layer selection gradient Gs1 and a first phase gradient (not shown); the first readout gradient Gr1 further has a first predispersion phase gradient PrePhase1, a first platform gradient RO1 and a first redispersion phase gradient RePhase1, in which the duration and the amplitude of the first predispersion phase gradient PrePhase1 are equal to those of the first redispersion phase gradient RePhase1, and therefore the areas (equal to duration multiplying amplitude) thereof would also be equal.

As shown in FIG. 2, during the first platform gradient RO1, the magnetic resonance imaging system reads out (collects) two asymmetric echo magnetic resonance signals, i.e., the first free induction decay (FID) signal FID1 and the first echo signal Echo1. As shown in FIG. 2, the first repetition time TR1 partially depends on the duration of the two asymmetric echo magnetic resonance signals.

In which, in order to collect the two asymmetric echo magnetic resonance signals, i.e., the first free induction decay (FID) signal FID1 and the first echo signal Echo1, the dual echo steady state sequence is set as follows: the area of the first predispersion phase gradient PrePhase1 is smaller than the area of 1/N of the first platform gradient RO1, and the area of said first platform gradient RO1 is smaller than the area of a second platform gradient RO2.

Figure 3:
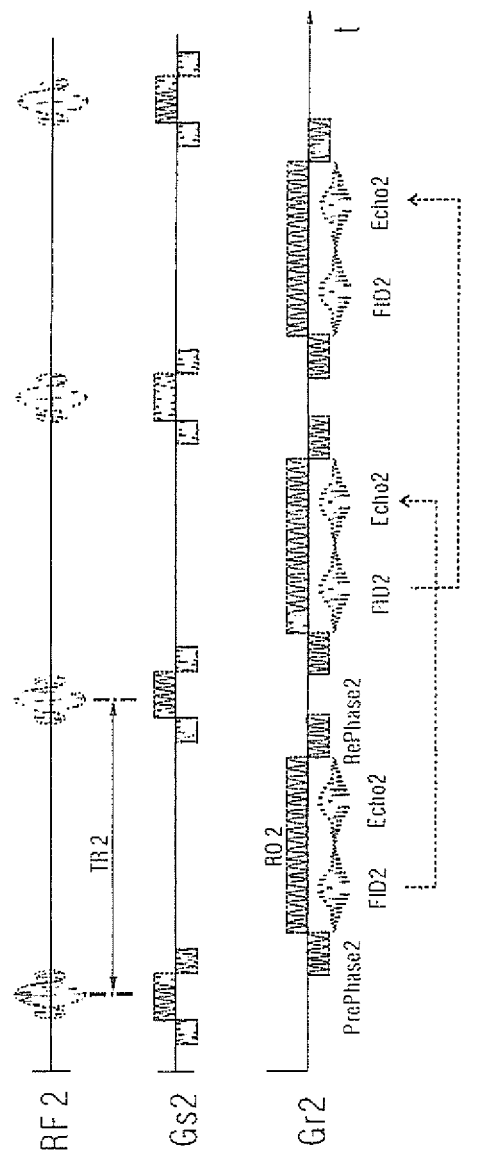
FIG. 3 is a timing diagram for the dual echo steady state sequence according to the prior art.

As for the area of the second platform gradient RO2, FIG. 3 is a timing diagram for the dual echo steady state sequence according to the prior art. As shown in FIG. 3, the symmetric multi-echo magnetic resonance signals (full multi-echo magnetic resonance signals) collected (read out) using the dual echo steady state sequence of the prior art correspond to the asymmetric echo magnetic resonance signals collected (read out) using the dual echo steady state sequence of the particular embodiments of the present invention (symmetric multi-echo magnetic resonance signals are N full-echo magnetic resonance signals which respectively correspond to said N asymmetric echo magnetic resonance signals), in other words, the complete signals of the asymmetric echo magnetic resonance signals collected (read out) using the dual echo steady state sequence of particular embodiments of the present invention are the symmetric multi-echo magnetic resonance signals (full multi-echo magnetic resonance signals) collected (read out) using the dual echo steady state sequence of the prior art.

As shown in FIG. 3, the second platform gradient RO2 is used for collecting (reading out) the symmetric multi-echo magnetic resonance signals, i.e., the second free induction decay (FID) signal FID2 and the second echo signal Echo2, wherein, the duration $T_{RO2}$ of the second platform gradient RO2 is the sum of the duration $ADC_{FID2}$ of the second free induction decay (FID) signal FID2 and the duration $ADC_{Echo2}$ of the second echo signal Echo2. The duration $ADC_{FID2}$ of the second free induction decay (FID) signal FID2 is the reciprocal of the collection bandwidth $BW_{FID2}$ of the second free induction decay (FID) signal FID2, as shown in the following equation, $$ADC_{FID2}=1/BW_{FID2};$$

The duration $ADC_{Echo2}$ of the second echo signal Echo2 is the reciprocal of the collection bandwidth $BW_{Echo2}$ of the second echo signal Echo2, as shown in the following equation, $$ADC_{FID2}=1/BW_{Echo2}.$$

Both the collection bandwidths $BW_{FID2}$ and $BW_{Echo2}$ are set by the user. The wider the collection bandwidth is, the sharper the images are, but the ratio of signal to noise of the images would be reduced accordingly.

Based on the above situation, in the dual echo steady state sequence according to the particular embodiments of the present invention, the duration $T_{RO1}$ of the first platform gradient RO1 is 80% of duration $T_{RO2}$ of the second platform gradient RO2, meanwhile, the duration $T_{PrePhase1}$ of the first predispersion phase gradient PrePhase1 is 80% of 1/N of the duration $T_{RO1}$ of said first platform gradient RO1, and therefore the duration $T_{PrePhase1}$ of the first predispersion phase gradient PrePhase1 is about 64% of the duration $T_{PrePhase2}$ of the second predispersion phase gradient PrePhase2. It can be seen that the duration of the dual echo steady state sequence according to the particular embodiments of the present invention is greatly shortened as compared to that of the dual echo steady state sequence according to the prior art. In addition, other various empirical percentage values except for 80% can be employed.

In addition, as shown in FIG. 2, the latter first echo signal Echo1 is the refocused signal of the former first free induction decay (FID) signal FID1, and therefore the latter first echo signal Echo1 keeps the information of the former first free induction decay (FID) signal FID1. It can be seen therefrom that although asymmetric echo magnetic resonance signals are used, there is no loss of image information.

FIG. 4 schematically illustrates a magnetic resonance apparatus operable in accordance with the invention. The magnetic resonance apparatus has an MR scanner 1 that is operated as described above by a control computer 2. A reconstruction processor 3 accesses the k-space data and reconstructs an image therefrom, also as described above.

According to the particular embodiments of the present invention, relatively short repetition time TR and echo time TE can be obtained by collecting asymmetric echo magnetic resonance signals in a dual echo steady state sequence to replace the symmetric echo (full) magnetic resonance signals, so that scanning time is reduced and the degree of comfort of a subject is improved; meanwhile, the relatively short repetition time TR can also make the magnetization process reach a steady state quickly, and make the magnetic resonance signals be less affected by the inhomogeneity of a main magnetic field or a gradient magnetic field; while the relatively short echo time TE increases the intensity of the magnetic resonance signals.

In summary, according to the particular embodiments of the present invention, by reading out asymmetric echo magnetic resonance signals in a dual echo steady state sequence to replace the symmetric echo (full) magnetic resonance signals, scanning time is saved and clinical images of good quality are obtained.

Although modifications and changes may be suggested by those skilled in the art, it is the intention of the inventors to embody within the patent warranted hereon all changes and modifications as reasonably and properly come within the scope of their contribution to the art.

We claim as our invention:

1. A magnetic resonance (MR) imaging method, comprising:
    operating an MR scanner, while a subject is situated therein, to scan the subject with a multi-echo MR data acquisition sequence, including exciting nuclear spins in the subject, with the excited nuclear spins producing N asymmetric magnetic resonance echo signals, wherein N is greater than or equal to 2, and including activating a readout gradient comprising a predispersion phase gradient, a first platform gradient, and a second platform gradient, with an area of said predispersion phase gradient being less than 1/N of an area of said first platform gradient, and an area of said first platform gradient being less than an area of the second platform gradient, and wherein said MR data are read out from N symmetric magnetic resonance echo signals;
    operating said MR scanner to read out raw data from the subject during said N asymmetric magnetic resonance echo signals, and entering the raw data into an electronic memory as k-space data; and
    accessing said k-space data from a processor and, in said processor, reconstructing a magnetic resonance image of the subject from said k-space data, and making the magnetic resonance image available at an output of the computer in electronic form as a datafile.

2. An MR imaging method as claimed in claim 1 comprising operating said MR scanner with said multi-echo data acquisition sequence being a sequence selected from the group consisting of a dual-echo steady-state free precession sequence and a multi-echo data image combination sequence.

3. A method as claimed in claim 1 wherein the area of said first platform gradient is 80% of the area of said second platform gradient.

4. An MR imaging method as claimed in claim 1 wherein an area of said predispersion phase gradient is 80% of 1/N of the area of said first platform gradient.

5. A magnetic resonance (MR) apparatus, comprising:
an MR scanner;
a control computer configured to operate said MR scanner, while a subject is situated therein, to scan the subject with a multi-echo MR data acquisition sequence, including exciting nuclear spins in the subject, with the excited nuclear spins producing N asymmetric magnetic resonance echo signals, wherein N is greater than or equal to 2, and including activating a readout gradient comprising a predispersion phase gradient, a first platform gradient, and a second platform gradient, with an area of said predispersion phase gradient being less than 1/N of an area of said first platform gradient, and an area of said first platform gradient being less than an area of the second platform gradient, and wherein said MR data are read out from N symmetric magnetic resonance echo signals;
said control computer being configured to operate said MR scanner to read out raw data from the subject during said N asymmetric magnetic resonance echo signals, and to enter the raw data into an electronic memory as k-space data; and
a processor configured to access said k-space data and to reconstruct a magnetic resonance image of the subject from said k-space data, and to make the magnetic resonance image available at an output of the computer in electronic form as a datafile.

6. An MR apparatus as claimed in claim 5 comprising wherein said control computer is configured to operate said MR scanner with said multi-echo data acquisition sequence being a sequence selected from the group consisting of a dual-echo steady-state free precession sequence and a multi-echo data image combination sequence.

7. An MR apparatus as claimed in claim 5 wherein said control computer is configured to operate the MR scanner with the area of said first platform gradient is 80% of the area of said second platform gradient.

8. An MR apparatus as claimed in claim 5 wherein said control computer is configured to operate the MR scanner with an area of said predispersion phase gradient is 80% of 1/N of the area of said first platform gradient.

* * * * *